United States Patent [19]
Yang et al.

[11] Patent Number: 5,827,437
[45] Date of Patent: Oct. 27, 1998

[54] MULTI-STEP METALLIZATION ETCH

[75] Inventors: Richard Yen-chang Yang, Fremont; Kenlin Chenjin Huang, Milpitas, both of Calif.

[73] Assignee: Lam Research Corporation, Fremont, Calif.

[21] Appl. No.: 649,268

[22] Filed: May 17, 1996

[51] Int. Cl.$^6$ ........................................................ C23F 1/00
[52] U.S. Cl. ................................ 216/77; 216/64; 216/67; 438/738
[58] Field of Search ................................. 216/67, 64, 77; 156/646.1; 438/738

[56] References Cited

U.S. PATENT DOCUMENTS 5,421,891  6/1995  Campbell .

OTHER PUBLICATIONS

Unknown, "TCP$^{198}$ 9600 Maintenance," Rev. B—Jan. 15, 1995, Lam Research Corp., Fremont, CA.

Inspec 91:4023936 abst of "High density plasma etching of aluminum alloys", Bradley 1991 Proceedings 8th International IEEE VLSI Conf. pp. 298–300, 1991.

Inspec 94:4813929 abst of "Etching of aluminum alloys in the transformer–coupled plasma etcher", Yunju, Journal of Vacuum Sciencwe and Technology A, vol. 12(4), pt 1 pp. 1328–1333, 1994.

*Primary Examiner*—Gary Geist
*Assistant Examiner*—Jean F. Vollano
*Attorney, Agent, or Firm*—Beyer & Weaver, LLP

[57] ABSTRACT

A method for etching through a selected portion of a metallization layer of a wafer's layer stack in a high density plasma processing chamber includes performing a main etch by etching at least partially through the metallization layer of the layer stack with a main-etch etchant source gas that includes essentially $Cl_2$ and $BCl_3$ having a first $Cl_2:BCl_3$ flow ratio. Thereafter, an over etch is performed by etching to a layer underlying the metallization layer with an over-etch etchant source gas that includes essentially $Cl_2$ and $BCl_3$ having a second $Cl_2:BCl_3$ flow ratio that is higher than the first $Cl_2:BCl_3$ flow ratio. The method may further include the step of performing a barrier layer etching step for etching a barrier layer of the layer stack prior to performing the over etch.

25 Claims, 3 Drawing Sheets

MULTI-STEP METALLIZATION ETCH

BACKGROUND OF THE INVENTION

The present invention relates to the fabrication of semiconductor integrated circuits (IC's). More particularly, the present invention relates to methods for etching through an IC's layer stack, including a metallization layer, during IC fabrication.

In semiconductor IC fabrication, devices such as component transistors are formed on a semiconductor wafer or substrate, which is typically made of silicon. Successive layers of various materials are deposited onto the wafer or substrate to form a layer stack. A barrier layer, typically formed of Ti, TiW, TiN or other suitable barrier materials, may be disposed over the silicon wafer. The barrier layer functions to prevent the diffusion of dopant atoms from the oxide layer into a metallization layer which is typically deposited over the barrier layer. Metallic interconnect lines, which are etched from the metallization layer by etching the layer stack, are then employed to couple the devices of the IC together to form the desired circuit.

It should be noted that other additional layers which have not been described may be present above, below, or between the metallization layer and the other layers of the layer stack. Further, not all of the described layers need to be present and some or all may be substituted by other different layers.

The metallization layer typically is made up of aluminum or one of the known aluminum alloys such as Al—Cu, Al—Si, or Al—Cu—Si. The metallization layer may also be tungsten or an aluminum tungsten alloy. For convenience, this layer is referred to herein as the metallization layer. It should be understood that such a reference may include a layer consisting of, for example, any of the aforementioned aluminum or tungsten alloys.

The layer stack also typically includes an anti-reflective coating (ARC) layer and an overlaying photoresist (PR) layer, and/or a hard mask layer which is typically oxide. These layers are formed atop the metallization layer. The ARC layer, typically TiN or TiW, helps prevent light (e.g., from the lithography step that patterns the photoresist) from being reflected and scattered off the surface of the metallization layer and may, in some cases, inhibit hillock growth. The photoresist layer and/or hard mask represents a layer of conventional photoresist and/or oxide materials, which may be patterned for etching, e.g., through exposure to optical light, deep ultraviolet rays, or electron beams.

The layers of the layer stack are readily recognizable to those skilled in the art and may be formed using any of a number of suitable and known deposition processes. These processes may include chemical vapor deposition (CVD), plasma-enhanced chemical vapor deposition (PECVD), and physical vapor deposition (PVD) such as sputtering.

To form the aforementioned metallic interconnect lines, a portion of the layers of the layer stack, including the metallization layer, are etched using a suitable photoresist technique. By way of example, one such photoresist technique involves the patterning of the photoresist layer by exposing the photoresist material in a contact or stepper lithography system, and the development of the photoresist material to form a mask and dry etch of hard mask to facilitate subsequent etching. Using an appropriate etchant, the areas of the metallization layer that are unprotected by the mask are then etched away, leaving behind metallization interconnect lines or features.

To achieve greater circuit density, modern IC circuits are scaled with increasingly narrower design rules. As a result, the feature sizes such as the width of the interconnect lines or the spacings (e.g., trenches) between adjacent interconnect lines, have steadily decreased. By way of example, while a line width of approximately 0.8 microns ($\mu$) is considered acceptable in a 4 megabit (Mb) dynamic random access memory (DRAM) IC, 256 Mb DRAM IC's preferably employ interconnect lines as thin as 0.25 microns or even thinner.

As the feature sizes shrink, it becomes increasingly difficult to achieve a uniform etch rate across the wafer. Typically, the etch rate in the narrow spacings is slower than that in wider trenches or open field regions. This phenomenon, referred herein as microloading, may be a consequence of aspect ratio dependent etching (ARDE), etch rate loading, or reactive ion etching loading (RIE lag). The microloading causes trenches to be formed in the layer stack at different rates. This microloading becomes more severe when trench widths fall below about 0.8 microns, and especially when trench widths fall below about 0.5 microns. As a result of the etch rate variations, by the time metal etching is complete in areas having a slow etch rate (e.g., in the narrower line spacings), over etching (e.g. the inadvertent removal of materials from underlying layers) may have already occurred in areas having a higher etch rate (e.g., the open field regions).

Profile microloading is another phenomenon that may occur and becomes a more significant problem as the feature sizes on the wafer shrink. Profile microloading refers to the tendency for the sidewalls of wide trenches or larger etched areas adjacent areas having dense features to bulge out toward the large open region rather than forming a desired anisotropic or vertical sidewall. These bulging sidewalls are caused by polymer buildup along the sidewall during the etching process which prevents the proper vertical etching of the sidewall.

For clarification, the phenomenon of microloading and profile microloading will be described with reference to FIGS. 1A and 1B. FIG. 1A illustrates a layer stack 100 before the etching process takes place. FIG. 1B illustrates the same layer stack after the etching process is complete. Layer stack 100 includes a silicon substrate 102, a barrier layer 104, a metallization layer 106, an anti-reflective coating (ARC) layer 108, and a patterned photoresist layer and/or hard mask 110 having openings 112 in which the photoresist has been removed to form a desired pattern to be etched. As mentioned above, it should be noted that other additional layers which have not been described may be present above, below, or between the metallization layer and the other layers of the layer stack. Further, not all of the described layers need to be present and some or all may be substituted by other different layers.

Microloading refers to the difference in the rate of etching in regions of the wafer having dense features (i. e. narrow trenches) compared to open field regions. To determine the microloading for a particular etching regime, a partial etch is performed using the etchant source gas and other parameters associated with the particular etching regime. Referring to FIG. 1B, dashed lines 114 and 116 indicate the depth to which the layer stack is etched by the partial etch. Due to the microloading phenomenon, the depth $D_2$ of the etch within narrow trenches, indicated by trenches 118, is not as deep as depth $D_1$ in more open regions, indicated by open region 120. Microloading may be quantified by the equation $(D_1-D_2)/D_1$ multiplied by 100 to express the microloading as a percentage of the overall etch depth.

Profile microloading refers to the tendency for the sidewalls of wide trenches or larger etched regions adjacent regions having dense features to bulge out toward the large open region rather than forming the desired vertical sidewall. This phenomenon is caused by the erosion of the photoresist and the build up of polymer on the sidewall during the etch process. In FIG. 1B, dashed line 122 indicates a sidewall which is adjacent open region 120 and which exhibits a significant amount of profile microloading. Because of the profile microloading, the remaining portion of the layer stack, indicated by layer stack portion 124, which is adjacent open region 120, has a width $CD_1$ which is greater than intended.

To determine whether profile microloading is present, the width of layer stack portion 124 may be compared with the width of another layer stack portion which is intended to be the same width and which is in a region with a high density of features (i. e. narrow trenches). In this case, width $CD_1$ of layer stack portion 124 is compared to a width $CD_2$ of a layer stack portion 126 which is in high density region indicated by narrow trenches 118. If $CD_1$ is greater than $CD_2$, then profile microloading is present.

In view of the foregoing, what is desired is improved methods for minimizing the microloading and the profile microloading associated with etching the metallization layer of the layer stack while providing commercially advantageous etch rates and etching selectivities between different layer materials of the layer stack.

SUMMARY OF THE INVENTION

As will be described in more detail hereinafter, a method for etching through a selected portion of a metallization layer of a wafer's layer stack in a high density plasma processing chamber is disclosed. In one embodiment, the method includes performing a main etch by etching at least partially through the metallization layer of the layer stack with a main-etch etchant source gas that includes essentially chlorine ($Cl_2$) and boron trichloride ($BCl_3$) having a first $Cl_2:BCl_3$ flow ratio. Thereafter, an over etch is performed by etching to a layer underlying the metallization layer with an over-etch etchant source gas that includes essentially $Cl_2$ and $BCl_3$ having a second $Cl_2:BCl_3$ flow ratio that is higher than the first $Cl_2:BCl_3$ flow ratio. The method may further include the step of performing a barrier layer etching step for etching a barrier layer of the layer stack prior to performing the over etch.

In a preferred embodiment, the flow rate of the $BCl_3$ in the over-etch etchant source gas is about 0 standard cubic centimeters per minute (sccm), the flow rate for the main-etch etchant source gas is greater than the flow rate of the over-etch etchant source gas, and the chamber pressure within the plasma processing chamber during the main etch step is greater than the chamber pressure within the plasma processing chamber during the over etch step. More preferably, the flow rate for the $Cl_2$ in the main-etch etchant source gas is at least about 50 sccm and preferably at least about 200 sccm. Also, the chamber pressure within the plasma processing chamber during the main etch step is about 5 mTorr to about 25 mTorr and preferably about 12 mTorr to about 18 mTorr.

In yet another embodiment, a method of manufacturing an integrated circuit having components formed on a semiconductor wafer die which includes etched layers of a layer stack is disclosed. The method includes performing a main etch by etching at least partially through the metallization layer of the layer stack with a main-etch etchant source gas that includes essentially $Cl_2$ and $BCl_3$ having a first $Cl_2:BCl_3$ flow ratio. Thereafter, an over etch is performed by etching to a layer underlying the metallization layer with an over-etch etchant source gas that includes essentially $Cl_2$ and $BCl_3$ having a second $Cl_2:BCl_3$ flow ratio that is higher than the first $Cl_2:BCl_3$ flow ratio.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

Figure 1A:
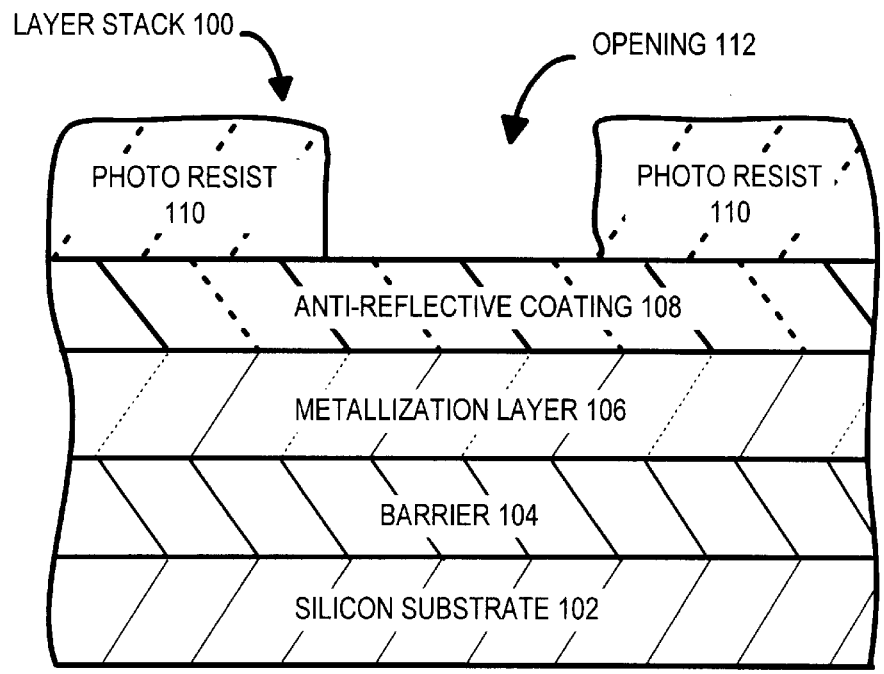
FIG. 1A illustrates a cross-sectional view of a layer stack representing the layers formed during the fabrication of a typical semiconductor IC before the inventive etch process.

An invention is described for minimizing, in a plasma processing chamber, the microloading problem and the profile loading problem while achieving commercially advantageous etch rates and selectivity using a main-etch etchant source gas for a main etch step and an over-etch etchant source gas for an over etch step. The main-etch etchant source gas (or feed gas) includes essentially chlorine ($Cl_2$) and boron trichloride ($BCl_3$) at a first $Cl_2:BCl_3$ flow ratio. The over-etch etchant source gas includes $Cl_2$ and possibly $BCl_3$ at a second $Cl_2:BCl_3$ flow ratio which is preferably higher than the first $Cl_2:BCl_3$ flow ratio of the main-etch etchant source gas.

In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one aspect of the present invention, the aforementioned microloading and profile loading problems are alleviated by etching the metallization layer with an etch process including a main etch and an over etch. The inventive etch technique may be performed in any known high density plasma processing apparatuses such as transformer-coupled plasma (TCP™) processing chambers. Other plasma etching systems may equally be utilized so long as they are capable of achieving relatively high pumping conductance and etchant gas flow rates at relatively low pressures. These other systems may include processing apparatus adapted for dry etching, plasma etching, reactive ion etching (MERIE), electron cyclotron resonance (ECR), or the like.

To further elaborate, in a typical plasma processing chamber adapted for dry etching, the wafer is treated with plasma. The chamber includes an inlet port through which process etchant source gases are supplied to the chamber interior. A suitable RF energy source is applied to electrodes associated with the chamber to induce a plasma from the etchant source gases. A bottom bias power independent of the power source may also be applied to provide independent bias control. The energy itself may be coupled inductively or capacitively to sustain the plasma, as is known. Species are then formed from the etchant source gas to react with the layer stack and etch away at the plasma-contacting regions of the wafer layer stack. The by-products, which may be volatile, are then exhausted through an exit port.

It is contemplated that the invention may be practiced in any of the above mentioned reactors, as well as other suitable plasma processing reactors. Note that the above is true irrespective of whether energy to the plasma is delivered through capacitively coupled parallel electrode plates, through ECR microwave plasma sources, or through inductively coupled RF sources such as helicon, helical resonators, and transformer coupled plasma. ECR and TCP™ (transformer coupled plasma) processing systems, among others, are readily available commercially. TCP™ systems are available from, for example, Lam Research Corporation of Fremont, Calif.

Figure 2:
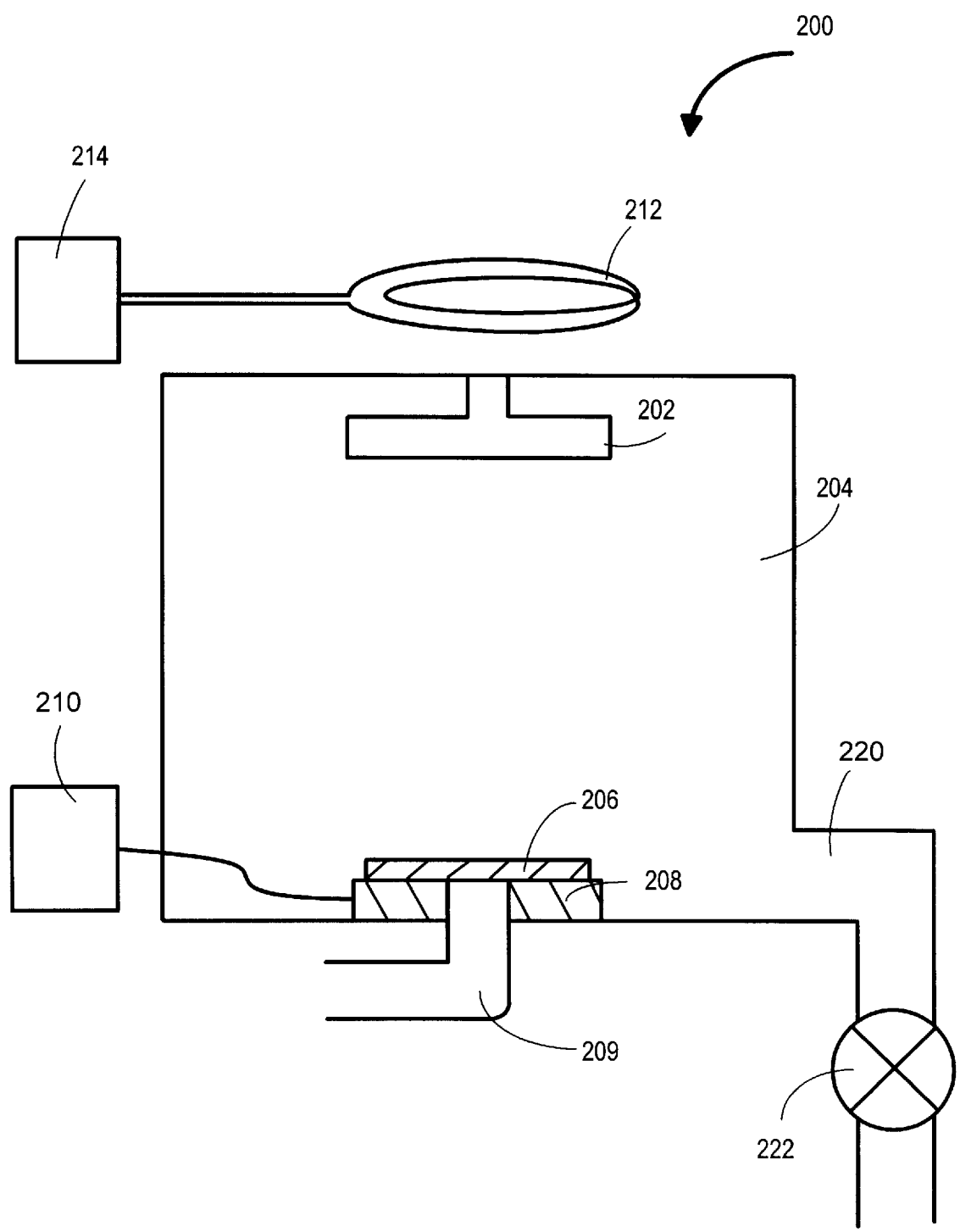
FIG. 2 is a simplified schematic diagram of a plasma reactor that may be suitably employed with the inventive etch technique.

FIG. 2 illustrates a simplified schematic of a plasma reactor 200 that is suitable for implementing the inventive etch process. Generally, reactor 200 includes a shower head 202 which preferably includes a plurality of holes for releasing gaseous source materials (i. e. the etchant source gases) into an RF-induced plasma chamber 204. The gaseous source materials may also be released by other means, e.g., from ports built into the walls of the chamber itself. A wafer 206 is introduced into chamber 204 and disposed on an electrostatic chuck 208 which acts as an electrode and is preferably biased by a radio frequency (RF) generator 210. Chuck 208 may alternatively be a conventional mechanical clamp type chuck connected to RF generator 210. Helium cooling gas may be introduced under pressure through port 209 between chuck 208 and wafer 206 to act as a heat transfer medium for accurately controlling the wafer's temperature during processing to ensure uniform and repeatable etching results.

Figure 1B:
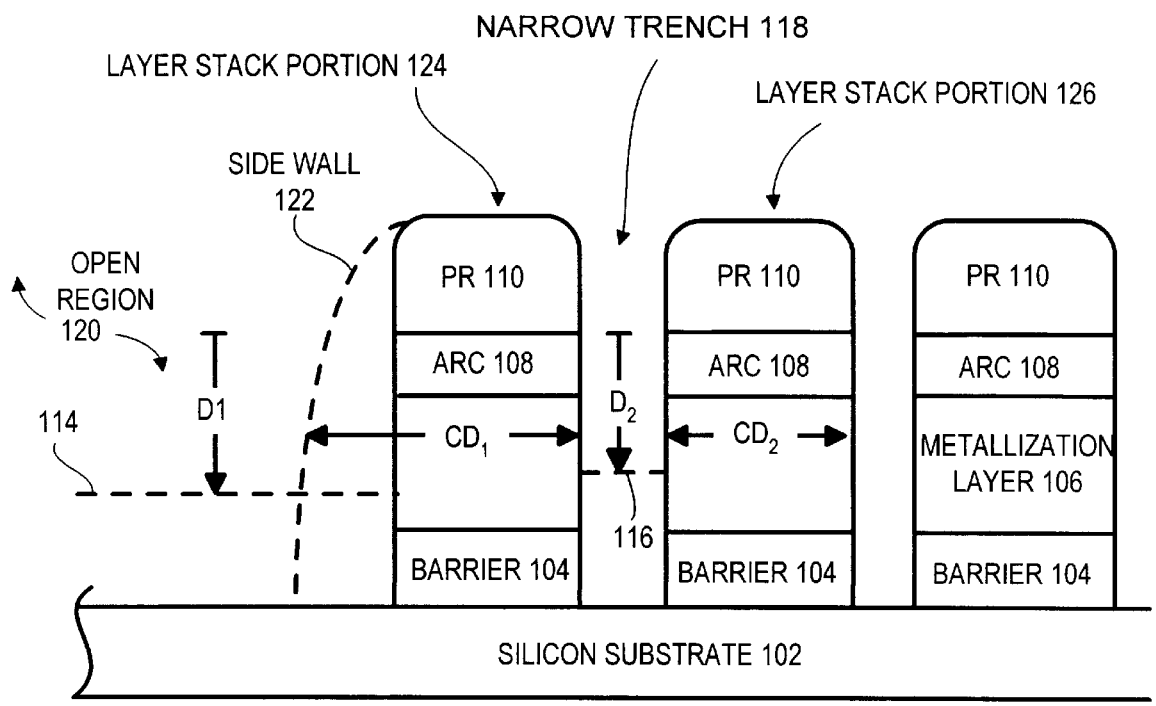
FIG. 1B illustrates a cross-sectional view of the layer stack of FIG. 1A after the inventive etch process is completed.

A second electrode 212 is disposed above chamber 204 and takes the form of a coil in the example of FIG. 2. Coil electrode 212 is energized by a RF generator 214 via a matching network (conventional and not shown in FIG. 1). RF generators 210 and 214, through electrode 212 and chuck 208, are used to strike a plasma in the etchant source gas within chamber 204 in order to etch wafer 206.

During plasma etching, the pressure within chamber 204 is preferably kept low by withdrawing gas through an exhaust port 220. In the example shown, a high capacity turbo pump 222 is connected to exhaust port 220 and is used to withdraw gas from chamber 204. In one embodiment, the present invention is employed in a Metal High Flow Alliance TCP™ plasma reactor developed by Lam Research Corporation, although any conventional and suitable plasma processing systems may well be employed. In accordance with the invention, plasma reactor 200 is a high flow system capable of relatively high etchant gas flow rates at relatively low pressures. For example, in one embodiment, the system is capable of maintaining a pressure of about 0.5 mTorr with a flow rate of about 50 standard cubic centimeters per minute (sccm) and a pressure of about 3 mTorr at a flow rate of about 300 sccm. A plurality of heaters (omitted from FIG. 2 to simplify the illustration) may be provided to maintain a suitable chamber temperature for etching (e.g., about 70° C. in one embodiment). To provide an electrical path to ground, the chamber wall of chamber 204 is typically grounded.

As mentioned above, the invention employs a main etch step using a main-etch etchant source gas and an over etch step using an over-etch etchant source gas. The main-etch etchant source gas includes essentially two components, chlorine ($Cl_2$) and boron trichloride ($BCl_3$), mixed at a first $Cl_2$:$BCl_3$ flow ratio. The over-etch etchant source gas also includes essentially $Cl_2$ and in some cases $BCl_3$. However, the over-etch etchant source gas is preferably mixed at a second $Cl_2$:$BCl_3$ flow ratio which is higher than the first $Cl_2$:$BCl_3$ flow ratio used for the main-etch etchant source gas. Sometimes, a small amount of inert gas, e.g., $N_2$ or Ar, might be added to provide additional passivation of sidewalls.

Chlorine ($Cl_2$), as is known in the art, is an active etchant gas commonly used for etching metallization layers such as aluminum. Typically, boron trichloride ($BCl_3$) is added to the chlorine as a passivation agent in order to reduce the erosion of the photoresist layer during the etching process. The $BCl_3$ may also help prevent undercutting of the sidewalls of the layer stack during the etching process. However, adding $BCl_3$ to the etchant source gas may have several disadvantages. These disadvantages may include reducing the etch rate which slows down the etching process. It is believed that $BCl_3$ also reduces the etch rate selectivity to photoresist and etch rate uniformity. Furthermore, $BCl_3$ may increase the microloading and profile microloading problems associated with the etching process. Therefore, it is desirable to use only the amount of $BCl_3$ in the etchant source gas that is necessary to prevent excessive erosion of the photoresist and prevent the undercutting of the layer stack sidewalls.

Although chlorine is mentioned throughout this description as being the active etching source gas, it should be understood that in some instances a fluorine based etchant source gases may be used in place of the chlorine based etchant source gas. For example, as is known in the art, fluorine based etchant source gases are believed to be better suited for etching metallization layers containing tungsten.

Etch rate selectivity refers to the ratio of the etch rate of the etchant source gas through a particular layer of the layer stack compared to another layer of the layer stack. For example, the etch rate of the metallization layer compared to the etch rate of the photoresist layer would be one commonly used measurement of the selectivity. Etch rate uniformity refers to quantifying the variation in etch rates at different regions of the wafer. For example, the etch rate in the central region of the wafer may be faster than the etch rate in the peripheral regions of the wafer. In one example, uniformity is measured using the one sigma approach which measures the depth of the etch at 29 locations and calculates a percentage variation based on these 29 measurements.

In accordance with one aspect of the present invention, the main etch step uses a relatively high $Cl_2$:$BCl_3$ flow ratio at a relatively high flow rate and a relatively low pressure compared with typical conventional etching process steps. The use of the high flow rate and low pressure significantly increases the ion energy and provides a very high etch rate compared to typical conventional etch rates. As will be described in more detail hereinafter, this high etch rate and high ion energy also reduces the requirement for $BCl_3$ passivation compared to typical passivation requirements using conventional etching process steps. This reduced amount of $BCl_3$, in combination of the high etch rate and high ion energy, reduces the microloading and profile microloading associated with the etch. This combination of high etch rate, high ion energy, and reduced amount of $BCl_3$ also improves the uniformity of the etch over the wafer area and the selectivity of the etch relative to conventional processes.

In accordance with another aspect of the present invention, an over etch is performed at some point after the main etch. Generally, the over etch is a relatively short cleanup etch relative to the main etch which is intended to remove any remaining residue and complete the etching process. In a preferred embodiment, the over etch is performed using either an even higher $Cl_2:BCl_3$ flow ratio than is used for the main etch (in fact in some cases essentially no $BCl_3$ is used in the over-etch etchant source gas) and/or an even lower pressure than is used for the main etch. In this embodiment, a lower flow rate than the main etch may also be employed. The use of the lower flow rate gives a slower, more controlled etch rate compared to the main etch step. The lower pressure further increases the ion energy providing improved residue removal. By reducing or eliminating the $BCl_3$ for the over etch step, very good selectivity and uniformity is achieved during the over etch.

Figure 3A:
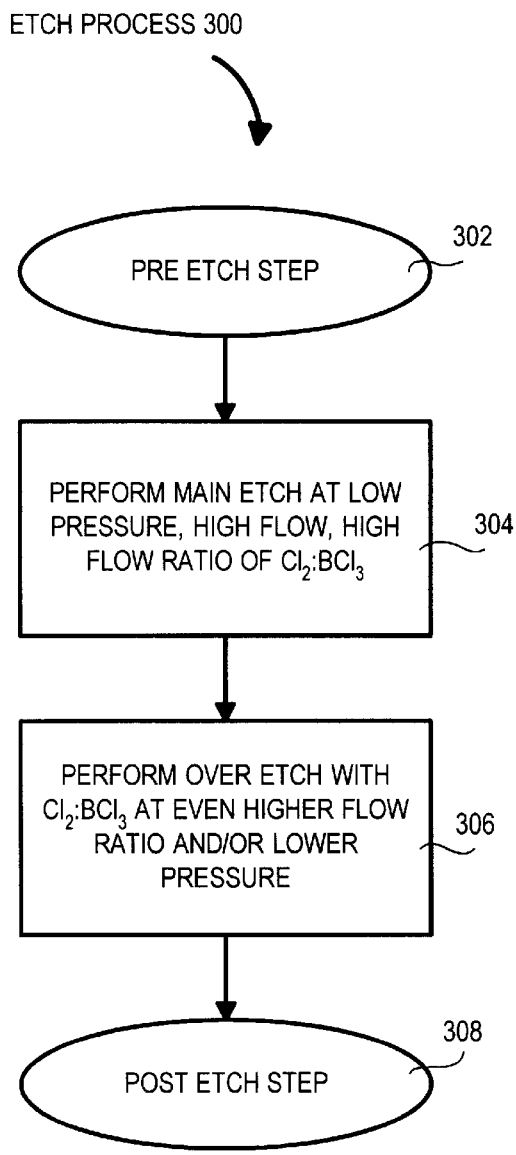
FIG. 3A is a flow chart showing the steps involved in the inventive etch process in accordance with one embodiment of the present invention.

FIG. 3A shows, in accordance with one aspect of the present invention, the steps involved in an inventive etch process 300. In step 302, a wafer is prepared for etching in a conventional pre-etch step. The pre-etch step may include, for example, clamping the wafer onto chuck, stabilizing the pressure within the plasma processing chamber, and introducing helium cooling gas to the wafer backside to facilitate heat transfer between the wafer and the chuck.

In step 304, the layer stack is etched using the main-etch etchant source gas at a relatively high flow rate and a relatively low pressure compared to conventional etching processes. The main-etch etchant source gas includes $Cl_2$ and $BCl_3$, preferably at a relatively high flow ratio of $Cl_2:BCl_3$. Preferably, the metallization layer is substantially etched through by the main-etch etchant source gas. In one embodiment, both the anti-reflective layer and the metallization layer may be etched through using the inventive main-etch etchant source gas. The main-etch etchant source gas may also be employed to etch through the barrier layer containing, for example, Ti or TiN.

After main etch step 302, an over etch step 304 may optionally be performed. In one embodiment, an over etch step may not be necessary if the high flow rate and/or low pressure and/or high $Cl_2:BCl_3$ main etch alone can sufficiently achieve the desired etch goals, e.g., minimizing microloading and profile microloading, among others. In over etch step 304, the layer stack is etched using an over-etch etchant source gas including $Cl_2$ and possibly $BCl_3$. The over etch step is employed as a clean up etch to finish the etch process and remove residue from the wafer. The over etch step uses an even higher $Cl_2:BCl_3$ flow ratio than used in main etch step 302, and preferably, a lower pressure and/or a lower flow rate than used in main etch step 302.

In step 306, the wafer may undergo additional processing steps to fabricate the desired components as well as post-etch processing steps that are conventional in nature. Thereafter, the finished wafer may be cut into dies, which may then be made into IC chips. The resulting IC chip, may then be incorporated in an electronic device as any of the well known commercial or consumer electronic devices.

Figure 3B:
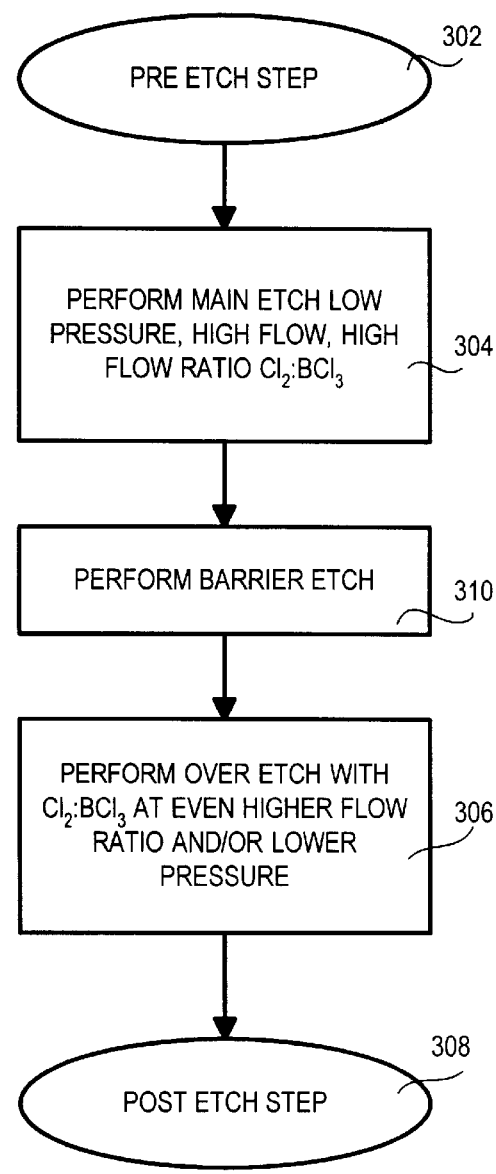
FIG. 3B is a flow chart showing the steps involved in the inventive etch process in accordance with another embodiment of the present invention.

Alternatively, as shown in FIG. 3B, the main etch step 302 may optionally be followed by a barrier layer etch step 310. This barrier layer etch step 310 may be employed to optimize the etching of the barrier layer using a barrier-etch etchant source gas. The barrier-etch etchant source gas may include other gases depending on the specific constitution of the barrier layer. In a similar manner, it is possible as well to use other source etchant gases to etch through the ARC layer, or other particular layers that may be present.

The metallization layer etch rate, the metallization layer to photoresist selectivity, the uniformity, and the microloading achieved using the inventive main etch/over etch method are found to be well within commercially desirable ranges. These commercially feasible ranges are, for example, above about 5,000 angstroms/minute for the metallization layer or aluminum etch rate and between about 2 to 1 to about 5 to 1 for the metallization layer to photoresist selectivity. The commercially desirable limits for the uniformity and microloading are typically less than 10%. It should be kept in mind that the specific process results achieved with the inventive main etch/over etch method are dependent on the deposition conditions of the metallization layer, the specific metallization alloy, the type and geometry of the reactor, and the etching process parameters.

In general, the metallization layer etch rate (i. e. aluminum etch rate) depends on the particular volumetric flow ratio of the two gases, $Cl_2$ and $BCl_3$, as well as the total gas flow and the reactor chamber pressure. In accordance with one aspect of the invention, the main etch step of the inventive method uses a main-etch etchant source gas at a relatively high flow ratio, a high flow rate, and a low pressure compared to conventional etching processes. By way of example, in a high plasma density reactor configuration such as the aforementioned Metal High Flow Alliance TCP™, the aluminum etch rate achieved during the main etch step for a 200 mm wafer with $Cl_2:BCl_3$ flow ratio of about 4:1, a total flow rate of about 300 sccm, and a pressure of about 15 mTorr is approximately 12,000 angstroms per minute. As indicated by this example, the main etch step of the inventive main etch/over etch method provides a high, commercially advantageous aluminum etch rate.

As mentioned above, this high etch rate provides several additional benefits. Applicants have found that the high etch rate associated with the inventive method improves the uniformity, the selectivity, and the microloading during the main etch. Compared to conventional processes, the high etch rate also reduces the requirement for $BCl_3$, which is used for passivation of the photoresist layer. The reduced requirement for $BCl_3$ further improves the selectivity, uniformity, and microloading associated with the main etch. By way of example, for the particular embodiment described immediately above, the aluminum to photoresist etch rate selectivity is about 3.4:1 and the one sigma uniformity is about 4%. These selectivity and uniformity values are well within the commercially desirable aluminum to photoresist selectivity range and uniformity limits.

In accordance with another aspect of the inventive method, an over etch is performed at some point after the main etch. The over etch is intended to remove any remaining residue and complete the etching process. Preferably, the over etch step has a slower etch rate relative to the main etch step for a more controlled etch. This is accomplished by using a lower etchant source gas flow rate than was used in the main etch step. Also, the over etch step preferably utilizes a lower pressure than was used in the main etch step. This lower pressure further increases the ion energy thereby increasing the bombardment to be even greater than that of the main etch step. This higher bombardment substantially improves the residue removal.

As mentioned above, the over-etch etchant source gas also preferably has a higher $Cl_2:BCl_3$ flow ratio than was used for the main etch step. In fact, in a preferred embodiment, essentially no $BCl_3$ is used in the over-etch etchant source gas. Without including $BCl_3$ in the over-etch etchant source gas, the over etch step erodes the photoresist at a relatively high rate. However, in accordance with another aspect of the invention, the over step is performed for a relatively short period of time. This short period of time is not long enough for the over-etch etchant source gas to etch through the photoresist layer, however, it is long enough to finish the etching process and remove substantially all of the remaining residue.

In the over etch step, the aluminum to oxide selectivity becomes more important. A high aluminum to oxide selectivity reduces the amount of etching of the oxide layer while allowing the completion of the etching of any remaining metallization layer or barrier layer. Using the above described combination of very low pressure (i.e. high ion energy and high bombardment), lower flow rate, and higher flow ratio (i.e. essentially no $BCl_3$) an aluminum to oxide selectivity greater than 15:1 was achieved. This high selectivity allows for a very reliable over etch step which provides excellent overall etching results.

Although the main-etch and over-etch etchant source gases have been described as including essentially chlorine and boron trichloride, the etchant source gases may contain an inert component such as argon or helium in amounts up to 80 sccm and still remain within the scope of the present invention. As the term is used herein, "percent by volume" refers to the percent by volume of a particular gas to the gas composition that is fed to the reaction chamber, which is typically expressed in units of standard cubic centimeters per minute (sccm). Furthermore, the etchant source gases of the present invention may contain up to 50 sccm of a polymerizing component such as $CHF_3$ or $CF_4$. These polymerizing components facilitate passivation of the aluminum sidewall, thereby minimizing the undercutting of the aluminum sidewall and ensuring a more anisotropic etch effect (i.e., a more vertical aluminum sidewall after etching). Also, the etchant source gases of the present invention may contain up to 100 sccm of any other gas, including any chlorine, bromine, or fluorine-containing gas.

The specific processing parameters and conditions suitable for employing the inventive main etch/over etch method depends on the specific type and geometry of reactor. For one specific example, Tables 1 and 2 respectively summarize the possible approximate process parameter ranges for the main etch step and the over etch step that may be useful when etching a wafer such as an eight inch wafer having a 1.1 micron thick photoresist layer and a 8000 Å aluminum metallization layer in a high plasma density reactor such as the Metal High Flow Alliance TCP™ reactor. Applicants have not tested all of the variations of the following ranges, however, experiments have indicated that these ranges may be useful depending upon the specific reactor utilized and the particular wafer to be etched.

TABLE 1

Main Etch Process Parameters

|  | Suitable Range | Preferred Range | More Preferred Range |
| --- | --- | --- | --- |
| Pressure | 5–25 mTorr | 12–18 mTorr | 15 mTorr |
| Flow Rate | 100–500 sccm | 250–350 sccm | 300 sccm |
| Flow Ratio $Cl_2:BCl_3$ | 0.5:1 to Infinite | 1:1 to Infinite | 4:1 |

As indicated in Table 1, the reactor chamber pressure for the main etch step may range from about 5 mTorr to about 25 mTorr, more preferably from about 12 mTorr to about 18 mTorr, and even more preferably be about 15 mTorr. For this configuration, the main-etch etchant source gas flow rate may range from about 100 sccm to about 500 sccm, more preferably from about 250 sccm to about 350 sccm, and even more preferably be about 300 sccm. And, using this configuration, the main-etch etchant source gas $Cl_2:BCl_3$ flow ratio may range from about 0.5:1 to about infinity (i.e. essentially no $BCl_3$), more preferably from about 1:1 to infinity, and even more preferably be about 4:1.

TABLE 2

Over Etch Process Parameters

|  | Suitable Range | Preferred Range | More Preferred Range |
| --- | --- | --- | --- |
| Pressure | 0.5–10 mTorr | 2–8 mTorr | 6 mTorr |
| Flow Rate | 50–350 sccm | 150–250 sccm | 200 sccm |
| Flow Ratio $Cl_2:BCl_3$ | 0.5:1 to Infinite | 1:1 to Infinite | Infinite |

As indicated in Table 2, for the same eight inch wafer in the Metal High Flow Alliance TCP™ reactor, the reactor chamber pressure for the over etch step may range from about 0.5 mTorr to about 10 mTorr, more preferably from about 2 mTorr to about 8 mTorr, and even more preferably be about 6 mTorr. For this configuration, the over-etch etchant source gas flow rate may range from about 50 sccm to about 350 sccm, more preferably from about 150 sccm to about 250 sccm, and even more preferably be about 200 sccm. And, using this configuration, the over-etch etchant source gas $Cl_2:BCl_3$ flow ratio may range from about 0.5:1 to about infinity (i.e. essentially no $BCl_3$), more preferably from about 1:1 to about infinity, and even more preferably the over-etch etchant source gas includes essentially no $BCl_3$.

The backside of the wafer may be cooled with helium having a pressure range of about zero to about 20 Torr. The bottom electrode and the walls of the reactor chamber may be heated to assist in the removal of the reaction by-products. Typical ranges of temperatures for the wafer-holding electrode are about 20 degrees to 100 degrees Celsius.

EXAMPLE

To further illustrate the advantages of the present invention, the following specific example will be described in detail. The experimental results were derived from etching experiments performed on the following wafer according to the approximate process parameters outlined below. It should be borne in mind that the example given below is merely illustrative of one application of the inventive etch technique and should in no way be construed to limit the usefulness of the invention when applied with other wafers, layer stack structures, etching systems, and/or process parameters.

An eight-inch silicon wafer (200 mm in diameter) was used for this experiment. The wafer included a 1.1 micron I-Line™ photoresist layer, an anti-reflective coating layer, an 8000 Å aluminum metallization layer with 0.5% copper and 1% silicon, a titanium barrier layer, and finally an oxide layer ($SiO_2$) immediately adjacent to the wafer's surface.

The wafer in these experiments was processed in the aforementioned Metal High Flow Alliance TCP™ reactor etching system. The reactor was equipped with an electrostatic chuck (ESC) for clamping a wafer to the bottom electrode. The reactor also utilized a high flow turbo pump for providing high flow rates at very low pressures. The specific configuration was capable of pumping about 50 sccm at a pressure of about 0.5 mTorr and about 300 sccm at a pressure of about 3 mTorr.

For this experiment, a three step etch was employed. All three steps in the recipe called for RF power to be applied to both the top and the bottom electrodes. Also, for each of the three steps, helium cooling gas was applied to the bottom of the wafer at a pressure of 10 Torr.

The first step was a main etch for etching the anti-reflective coating (ARC) and the bulk of the aluminum layer. Since the ARC was a relatively thin layer, no attempt was made to optimize the etching of the ARC layer. However, it is contemplated that this ARC layer etching may be optimized by adding an ARC etch prior to the main etch. In this ARC etch step, the gas composition may be varied, another gas composition may be employed, and/or the process parameters may be varied to optimize this ARC etch step.

The main etch step utilized a total etchant source gas flow rate of 300 sccm at a $Cl_2:BCl_3$ flow ratio of 4:1. This corresponds to a flow rate of 240 sccm for the $Cl_2$ and a flow rate of 60 sccm for the $BCl_3$. The chamber pressure was maintained at 15 mTorr throughout the main etch step which had a duration of approximately 50 seconds. The top electrode power was 540 watts and the bottom electrode power was 360 watts.

The second step of this example was a barrier layer etch. This step is not a requirement of the present invention. However, the barrier layer etch may be performed to optimize the etching of the barrier layer under the aluminum metallization layer. If the barrier layer etch is not employed, the main etch step would be used to perform the bulk of the etching of the barrier layer.

The third and final etch step for this example was the over etch step. This step is a clean up step of relatively short duration. The over etch step is intended to remove residue and finish the etching process. The over etch step utilized a total etchant source gas flow rate of 200 sccm. The etchant source gas was substantially entirely $Cl_2$ with substantially no $BCl_3$ being utilized. The chamber pressure was maintained at 6 mTorr throughout the main etch step which had a duration of approximately 20 seconds. The top electrode power was 550 watts and the bottom electrode power was 150 watts.

The approximate process results of this example for the main etch step, the over etch step, and the overall etch process are summarized as follows in Table 3:

TABLE 3

|  | Main Etch Step | Over Etch Step |
| --- | --- | --- |
| Etch Rate | 12,000 Å/min | 8,000 Å/min |
| Uniformity (using 1 sigma method) | 4% | 3% |
| Selectivity (aluminum to photoresist) | 3.4:1 | 2.8:1 |
| Selectivity (aluminum to oxide) | — | 18.2:1 |
| Overall Etch Process | | |
| Net Micro Loading | 5% or Less | |
| Profile Micro Loading | Reduced-Approaching Vertical Sidewalls | |

As shown in Table 3, the main etch step achieved a commercially advantageous etch rate 10 of 12,000 Å with an aluminum to photoresist selectivity of 3.4 to 1. The uniformity was measured to be less than 4% using the one sigma method for determining the uniformity.

As also indicated in Table 3, the overall etching process for this example resulted in a low net microloading of 5% or less. Profile microloading was also minimized to the point where the sidewalls adjacent open regions of the wafer were approaching vertical (i.e. exhibiting substantially no profile microloading).

While this invention has been described in terms of several preferred embodiments, there are alterations, permutations, and equivalents which fall within the scope of this invention. It should also be noted that there are many alternative ways of implementing the methods of the present invention. It is therefore intended that the following appended claims be interpreted as including all such alterations, permutations, and equivalents as fall within the true spirit and scope of the present invention.

What is claimed is:

1. In a high density plasma processing chamber, a method for etching through a selected portion of a metallization layer of a wafer's layer stack, said method comprising:

performing a main etch by etching at least partially through said metallization layer of said layer stack with a main-etch etchant source gas that comprises $Cl_2$ and $BCl_3$ and having a first $Cl_2:BCl_3$ flow ratio; and thereafter, performing an over etch by etching through a remainder of said metallization layer to a layer underlying said metallization layer with an over-etch etchant source gas that comprises $Cl_2$ and $BCl_3$ and having a second $Cl_2:BCl_3$ flow ratio that is higher than said first $Cl_2:BCl_3$ flow ratio.

2. The method of claim 1 wherein the flow rate for the main-etch etchant source gas is greater than the flow rate of the over-etch etchant source gas.

3. The method of claim 2 wherein the flow rate for the $Cl_2$ in the main-etch etchant source gas is at least about 50 standard cubic centimeters per minute (sccm).

4. The method of claim 3 wherein the flow rate for the $Cl_2$ in the main-etch etchant source gas is at least about 200 standard cubic centimeters per minute (sccm).

5. The method of claim 1 wherein the chamber pressure within the plasma processing chamber during the main etch step is greater than the chamber pressure within the plasma processing chamber during the over etch step.

6. The method of claim 5 wherein the chamber pressure within the plasma processing chamber during the main etch step is about 5 mTorr to about 25 mTorr.

7. The method of claim 6 wherein the chamber pressure within the plasma processing chamber during the main etch step is about 12 mTorr to about 18 mTorr.

8. The method of claim 7 wherein the chamber pressure within the plasma processing chamber during the main etch step is about 15 mTorr.

9. The method of claim 7 wherein the flow rate for the $Cl_2$ in the main-etch etchant source gas is at least about 150 standard cubic centimeters per minute (sccm).

10. The method of claim 9 wherein the flow rate for the $Cl_2$ in the main-etch etchant source gas is at least about 200 standard cubic centimeters per minute (sccm).

11. The method of claim 1 wherein the method further includes the step of performing a barrier layer etching step for etching a barrier layer of said layer stack prior to performing said over etch.

12. The method of claim 1 wherein a plasma in said plasma processing chamber is energized through capacitively coupled parallel electrode plates.

13. The method of claim 1 wherein a plasma in said plasma processing chamber is energized through an inductively coupled RF source.

14. The method of claim 13 wherein a plasma in said plasma processing chamber is energized by a transformer-coupled plasma source.

15. In a high density plasma processing chamber, a method for minimizing microloading and profile microloading while etching through a metallization layer of a wafer's layer stack, said method comprising:

performing a main etch by etching at least partially through said metallization layer of said layer stack with a main-etch etchant source gas that comprises $Cl_2$ and $BCl_3$ and having a first $Cl_2:BCl_3$ flow ratio; and thereafter, performing an over etch by etching through a remainder of said metallization layer to a layer underlying said metallization layer with an over-etch etchant source gas that comprises $Cl_2$ and $BCl_3$ and having a second $Cl_2:BCl_3$ flow ratio that is higher than said first $Cl_2:BCl_3$ flow ratio.

16. In a high density plasma processing chamber, a method for minimizing microloading and profile microloading while etching through a metallization layer of a wafer's layer stack, said method comprising:

performing a main etch by etching at least partially through said metallization layer of said layer stack with a main-etch etchant source gas that comprises $Cl_2$ and $BCl_3$ and having a first $Cl_2:BCl_3$ flow ratio; and thereafter, performing an over etch by etching through a remainder of said metallization layer to a layer underlying said metallization layer with an over-etch etchant source gas that comprises $Cl_2$ and having substantially no $BCl_3$.

17. The method of claim 15 wherein the flow rate for the main-etch etchant source gas is greater than the flow rate of the over-etch etchant source gas.

18. The method of claim 17 wherein the chamber pressure within the plasma processing chamber during the main etch step is greater than the chamber pressure within the plasma processing chamber during the over etch step.

19. The method of claim 18 wherein the method further includes the step of performing a barrier layer etching step for etching a barrier layer of said layer stack prior to performing said over etch.

20. A method of manufacturing an integrated circuit having components formed on a semiconductor wafer die, said die having thereon etched layers of a layer stack, said method comprising:

performing a main etch by etching at least partially through said metallization layer of said layer stack with a main-etch etchant source gas that comprises $Cl_2$ and $BCl_3$ and having a first $Cl_2:BCl_3$ flow ratio; and thereafter, performing an over etch by etching through a remainder of said metallization layer to a layer underlying said metallization layer with an over-etch etchant source gas that comprises $Cl_2$ and $BCl_3$ and having a second $Cl_2:BCl_3$ flow ratio that is higher than said first $Cl_2:BCl_3$ flow ratio.

21. In a high density plasma processing chamber, a method for etching through a selected portion of a metallization layer of a wafer's layer stack, said method comprising:

performing a main etch by etching at least partially through said metallization layer of said layer stack with a main-etch etchant source gas that comprises $Cl_2$ and $BCl_3$, said main etch is performed using a first chamber pressure within said high density plasma processing chamber;

thereafter, performing an over etch by etching through a remainder of said metallization layer to a layer underlying said metallization layer with an over-etch etchant source gas that comprises $Cl_2$ and $BCl_3$ said over etch is performed using a second chamber pressure within said high density plasma processing chamber that is lower than said first chamber pressure.

22. The method of claim 21 wherein said first chamber pressure is about 5 mTorr to about 25 mTorr.

23. The method of claim 22 wherein said first chamber pressure is about 12 mTorr to about 18 mTorr.

24. The method of claim 23 wherein said first chamber pressure is about 15 mTorr.

25. The method of claim 2 wherein the chamber pressure within the plasma processing chamber during the main etch step is greater than the chamber pressure within the plasma processing chamber during the over etch step.

* * * * *